(12) United States Patent
Paik et al.

(10) Patent No.: US 11,738,421 B2
(45) Date of Patent: *Aug. 29, 2023

(54) METHOD OF MAKING CARRIER HEAD MEMBRANE WITH REGIONS OF DIFFERENT ROUGHNESS

(71) Applicant: Applied Materials, Inc., Santa Clara, CA (US)

(72) Inventors: Young J. Paik, Campbell, CA (US); Ashish Bhatnagar, Fremont, CA (US); Kadthala Ramaya Narendrnath, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 53 days.

This patent is subject to a terminal disclaimer.

(21) Appl. No.: 17/240,917

(22) Filed: Apr. 26, 2021

(65) Prior Publication Data
US 2021/0245323 A1 Aug. 12, 2021

Related U.S. Application Data

(60) Division of application No. 16/227,911, filed on Dec. 20, 2018, now Pat. No. 11,007,619, which is a
(Continued)

(51) Int. Cl.
*H01L 21/321* (2006.01)
*B24B 41/06* (2012.01)
(Continued)

(52) U.S. Cl.
CPC .............. *B24B 37/30* (2013.01); *B24B 37/32* (2013.01); *H01L 21/3212* (2013.01)

(58) Field of Classification Search
None
See application file for complete search history.

(56) References Cited

U.S. PATENT DOCUMENTS

| 3,654,047 A | 4/1972 | Berkowitz |
| 4,132,037 A | 1/1979 | Bonora |

(Continued)

FOREIGN PATENT DOCUMENTS

| EP | 0774323 | 5/1997 |
| EP | 0841123 | 5/1998 |

(Continued)

OTHER PUBLICATIONS

U.S. Appl. No. 60/625,274, filed Nov. 4, 2004, Brezoczky et al.
(Continued)

*Primary Examiner* — Sylvia MacArthur
(74) *Attorney, Agent, or Firm* — Fish & Richardson P.C.

(57) ABSTRACT

An apparatus comprises a flexible membrane for use with a carrier head of a substrate chemical mechanical polishing apparatus. The membrane comprises an outer surface providing a substrate receiving surface, wherein the outer surface has a central portion and an edge portion surrounding the central portion, wherein the central portion has a first surface roughness and the edge portion has a second surface roughness, the first surface roughness being greater than the second surface roughness.

12 Claims, 4 Drawing Sheets

Related U.S. Application Data continuation of application No. 12/631,557, filed on Dec. 4, 2009, now Pat. No. 10,160,093.

(60) Provisional application No. 61/122,322, filed on Dec. 12, 2008.

(51) Int. Cl.
*B24B 7/20* (2006.01)
*B24B 37/30* (2012.01)
*B24B 37/32* (2012.01)

(56) References Cited

U.S. PATENT DOCUMENTS

| | | | |
|---|---|---|---|
| 4,319,432 A | 3/1982 | Day | |
| 4,512,113 A | 4/1985 | Budinger | |
| 4,834,382 A | 5/1989 | Spector | |
| 4,918,869 A | 4/1990 | Kitta | |
| 5,177,124 A * | 1/1993 | Questel | B29C 70/64 |
| | | | 428/44 |
| 5,193,316 A | 3/1993 | Olmstead | |
| 5,205,082 A | 4/1993 | Shendon et al. | |
| 5,423,716 A | 6/1995 | Strasbaugh | |
| 5,449,316 A | 9/1995 | Strasbaugh | |
| 5,486,129 A | 1/1996 | Sandhu et al. | |
| 5,584,751 A | 12/1996 | Kobayashi et al. | |
| 5,624,299 A | 4/1997 | Shendon | |
| 5,643,053 A | 7/1997 | Shendon | |
| 5,643,061 A | 7/1997 | Jackson et al. | |
| 5,738,574 A | 4/1998 | Tolles et al. | |
| 5,759,918 A | 6/1998 | Hoshizaki et al. | |
| 5,803,799 A | 9/1998 | Volodarsky et al. | |
| 5,830,806 A | 11/1998 | Hudson et al. | |
| 5,851,140 A | 12/1998 | Barns et al. | |
| 5,879,220 A | 3/1999 | Hasegawa et al. | |
| 5,957,751 A | 9/1999 | Govzman et al. | |
| 5,964,653 A | 10/1999 | Perlov et al. | |
| 6,024,630 A | 2/2000 | Shendon et al. | |
| 6,028,762 A | 2/2000 | Kamitani | |
| 6,063,203 A | 5/2000 | Satoh | |
| 6,068,549 A | 5/2000 | Jackson | |
| 6,080,050 A | 6/2000 | Chen et al. | |
| 6,132,298 A | 10/2000 | Zuniga et al. | |
| 6,146,259 A | 11/2000 | Zuniga et al. | |
| 6,159,079 A | 12/2000 | Zuniga et al. | |
| 6,162,116 A | 12/2000 | Zuniga et al. | |
| 6,165,058 A | 12/2000 | Zuniga et al. | |
| 6,183,354 B1 | 2/2001 | Zuniga et al. | |
| 6,227,955 B1 | 5/2001 | Custer et al. | |
| 6,277,014 B1 | 8/2001 | Chen et al. | |
| 6,290,584 B1 | 9/2001 | Kim et al. | |
| 6,422,927 B1 | 7/2002 | Zuniga | |
| 6,450,868 B1 | 9/2002 | Zuniga et al. | |
| 6,494,774 B1 | 12/2002 | Zuniga et al. | |
| 6,705,932 B1 | 3/2004 | Zuniga et al. | |
| 6,722,965 B2 | 4/2004 | Zuniga et al. | |
| 6,733,965 B2 | 5/2004 | Echt et al. | |
| 6,758,939 B2 | 7/2004 | Marquardt et al. | |
| 6,764,387 B1 | 7/2004 | Chen | |
| 6,776,694 B2 | 8/2004 | Zuniga et al. | |
| 6,857,945 B1 | 2/2005 | Chen et al. | |
| 6,923,714 B1 | 8/2005 | Zuniga et al. | |
| 6,855,043 B1 | 12/2005 | Tang et al. | |
| 6,979,250 B2 | 12/2005 | Zuniga et al. | |
| 7,001,245 B2 | 2/2006 | Chen | |
| 7,001,256 B2 | 2/2006 | Zuniga et al. | |
| 7,033,252 B2 | 4/2006 | Fuhriman et al. | |
| 7,086,939 B2 * | 8/2006 | Wilkinson | B24B 37/32 |
| | | | 452/41 |
| 7,101,273 B2 | 9/2006 | Tseng et al. | |
| 7,108,592 B2 * | 9/2006 | Fukaya | B24B 37/30 |
| | | | 451/287 |
| 7,160,493 B2 * | 1/2007 | Willis | B24B 37/32 |
| | | | 264/162 |
| 7,959,496 B2 | 6/2011 | Spiegel | |
| 10,160,093 B2 | 12/2018 | Paik et al. | |
| 11,007,619 B2 | 5/2021 | Paik et al. | |
| 2001/0041526 A1 | 11/2001 | Perlov et al. | |
| 2002/0039879 A1 | 4/2002 | Zuniga et al. | |
| 2002/0094767 A1 | 7/2002 | Zuniga et al. | |
| 2004/0175951 A1 | 9/2004 | Chen | |
| 2005/0028931 A1 * | 2/2005 | Fukaya | B24B 37/30 |
| | | | 156/345.12 |
| 2005/0269732 A1 | 12/2005 | De Haas et al. | |
| 2007/0184662 A1 | 8/2007 | Yamashita et al. | |
| 2007/0202785 A1 | 8/2007 | Oh et al. | |
| 2008/0119118 A1 | 5/2008 | Zuniga et al. | |
| 2009/0242125 A1 | 10/2009 | Paik et al. | |
| 2010/0173566 A1 | 7/2010 | Paik et al. | |
| 2010/0311311 A1 | 12/2010 | Paik et al. | |
| 2017/0001282 A1 * | 1/2017 | Oh | B29C 35/02 |
| 2019/0118336 A1 | 4/2019 | Paik | |
| 2020/0381286 A1 * | 12/2020 | Paik | H01L 21/6838 |
| 2021/0245323 A1 * | 8/2021 | Paik | B24B 37/30 |

FOREIGN PATENT DOCUMENTS

| | | |
|---|---|---|
| GB | 2307342 A | 5/1997 |
| JP | 54-115682 | 8/1979 |
| JP | 2243263 | 9/1990 |
| JP | 2003-528738 | 9/2003 |
| JP | 3103568 | 8/2004 |
| KR | 10-0366425 | 2/2003 |
| KR | 10-2007-0087966 | 8/2007 |
| TW | 565605 | 12/2003 |
| TW | I275454 | 3/2007 |
| TW | I259529 | 8/2007 |
| WO | WO 1999/07516 | 2/1999 |

OTHER PUBLICATIONS

International Search Report and Written Opinion in International Appln. No. PCT/US2009/067376, dated Jun. 24, 2020, 10 pages.
Machine Generated English Translation of CN 200951520, Published Sep. 26, 2007.

\* cited by examiner

METHOD OF MAKING CARRIER HEAD MEMBRANE WITH REGIONS OF DIFFERENT ROUGHNESS

CROSS-REFERENCE TO RELATED APPLICATIONS

This application is a divisional of U.S. patent application Ser. No. 16/227,911, filed Dec. 20, 2018, which is a continuation of U.S. patent application Ser. No. 12/631,557, filed Dec. 4, 2009, which claims priority to U.S. Provisional Application Ser. No. 61/122,322, filed on Dec. 12, 2008, the entire disclosures of which are incorporated by reference.

BACKGROUND

This invention relates to chemical mechanical polishing, and more particularly to a flexible membrane for use a carrier head for chemical mechanical polishing.

Integrated circuits are typically formed on substrates, particularly silicon wafers, by the sequential deposition of conductive, semiconductive or insulative layers. After each layer is deposited, it is etched to create circuitry features. As a series of layers are sequentially deposited and etched, the outer or uppermost surface of the substrate, i.e., the exposed surface of the substrate, becomes increasingly nonplanar. This nonplanar surface can present problems in the photolithographic steps of the integrated circuit fabrication process. Therefore, there is a need to periodically planarize the substrate surface. In addition, planarization is needed when polishing back a filler layer, e.g., when filling trenches in a dielectric layer with metal.

Chemical mechanical polishing (CMP) is one accepted method of planarization. This planarization method typically requires that the substrate be mounted on a carrier or polishing head. The exposed surface of the substrate is placed against a polishing pad, such as circular pad or linear belt, that moves relative to the substrate. The carrier head provides a controllable load on the substrate to push it against the polishing pad. Some carrier heads include a flexible membrane that provides a mounting surface for the substrate, and a retaining ring to hold the substrate beneath the mounting surface. Pressurization or evacuation of a chamber behind the flexible membrane controls the load on the substrate. A polishing liquid, such as a slurry with abrasive particles, is supplied to the surface of the polishing pad.

A reoccurring problem in CMP is non-uniform polishing, i.e., variation in the polishing rate across the substrate surface. For example, polishing may thoroughly remove conductive material in some areas while leaving conductive material residue in other areas.

SUMMARY

In one aspect, a membrane is described for use with a carrier head of a substrate chemical mechanical polishing apparatus. The membrane has an outer surface providing a substrate receiving surface. The outer surface has a central portion and an edge portion surrounding the central portion. The central portion has a first surface roughness and the edge portion has a second surface roughness, the first surface roughness being greater than the second surface roughness.

Embodiments of the membrane may include one or more of the following features. The edge portion of the outer surface of the membrane further comprises a peripheral portion extending upward from the outer surface. The second surface roughness is less than about 5 microinches. The first surface roughness is greater than about 15 microinches. A width of the edge portion is less than about 25 percent of a width of the central portion. The membrane further comprises features that have a first mean spacing over the central portion and a second mean spacing over the edge portion. The features in the central portion are roughly spherical bumps, and the features in the edge portion are of negligible size. The membrane comprises at least one material from a group consisting of chloroprene, silicon, and ethylene propylene diene M-class rubber, and the features of the membrane consist of the same material as the membrane. The edge portion and the central portion consist of the same material.

The membranes described herein can be used with a carrier head with a retaining ring. The membrane includes an inner surface that forms a boundary of a pressurizable chamber. The retaining ring surrounds the flexible membrane.

A method of using the membranes described herein is provided. The method includes applying a load to a substrate with a carrier head. A relative motion is created between the substrate and a polishing pad while applying the load. The relative motion causes polishing of the substrate and the second surface roughness causes an edge of the substrate to be polished at a rate greater than polishing the substrate with a carrier head having a membrane having the first roughness across an entirety of the outer surface. The substrate is released from the membrane. The central portion of the flexible membrane enables release of the substrate from the membrane.

DESCRIPTION OF DRAWINGS

Like reference symbols in the various drawings indicate like elements.

DETAILED DESCRIPTION

One reoccurring problem in CMP is underpolishing at an edge portion of the substrate. While various solutions, such as applying additional load to an edge of the substrate during polishing, can equalize the polishing rate across the substrate, the solutions often require redesign of a non-consumable part used in polishing, that is, the carrier head. A membrane used to back the substrate during polishing that has regions of decreased roughness can control the polishing rate in regions of the substrate that otherwise tend to be underpolished. A membrane with a substrate backing surface that has a smooth region surrounding a rough regions can provide uniform polishing across a substrate without modifying the carrier head itself.

Figure 1:
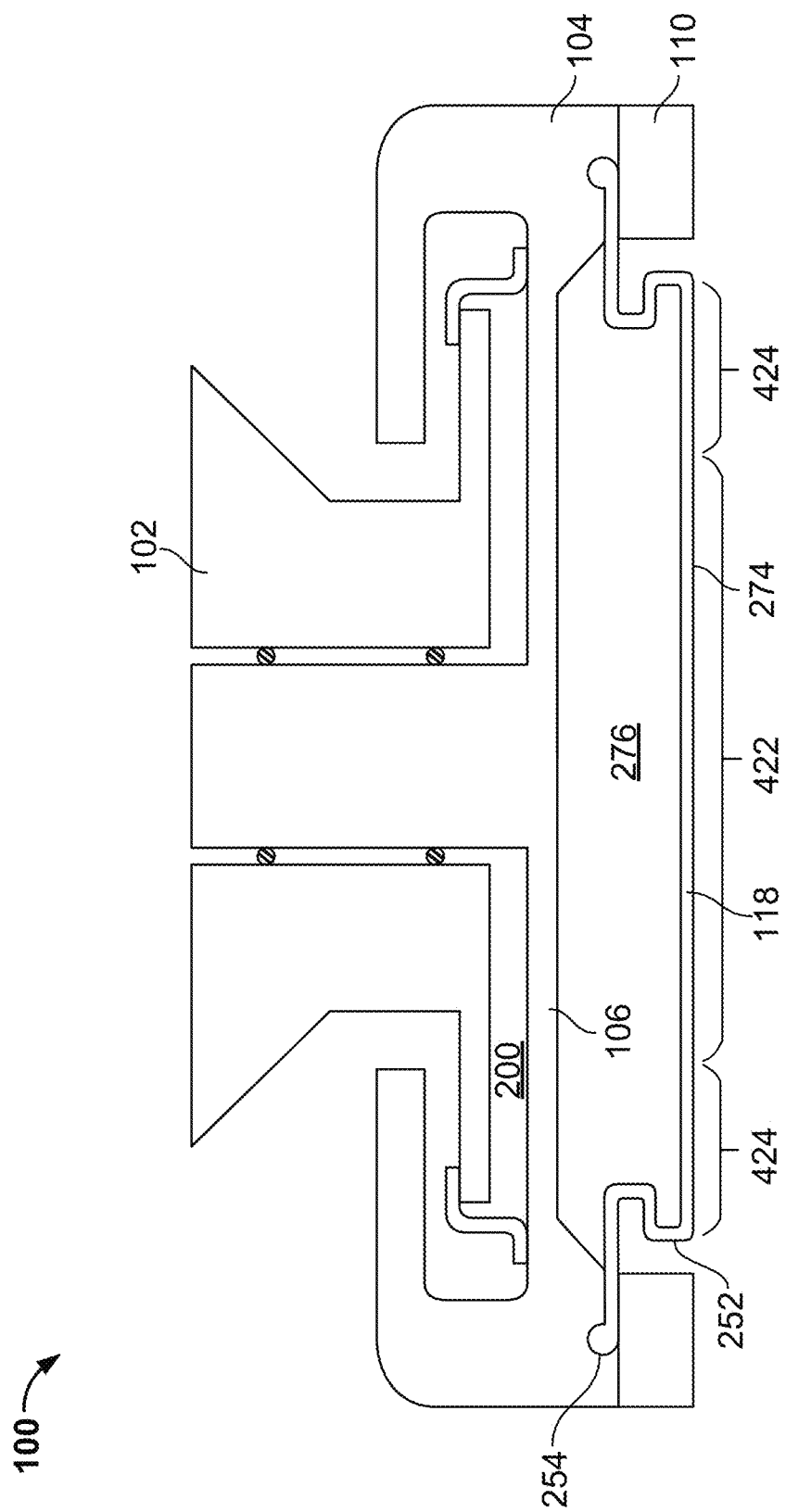
FIG. 1 is a schematic cross-sectional view of a carrier head.

Referring to FIG. 1, one or more substrates 10 will be polished by a chemical mechanical polishing (CMP) apparatus that includes a carrier head 100. A description of a similar CMP apparatus may be found in U.S. Pat. No. 5,738,574, the entire disclosure of which is hereby incorporated by reference.

Referring to FIG. 1, an exemplary carrier head 100 includes a housing 102, a base 104, a gimbal mechanism 106, a loading chamber 200, a retaining ring 110, and a flexible membrane 118 with a substrate receiving surface that has regions of differing surface roughness. A description of a carrier head that can be used with such a membrane may be found in U.S. Patent Publication No. 2008-0119118, U.S. Pat. Nos. 6,857,945, 6,422,927, 6,277,014, 6,183,354 or U.S. Pat. No. 6,146,259, the entire disclosures of which are hereby incorporated by reference. Other types of carrier heads with different components can alternatively be used and carrier head 100 is described merely as an example of one type of carrier head.

Figure 2:
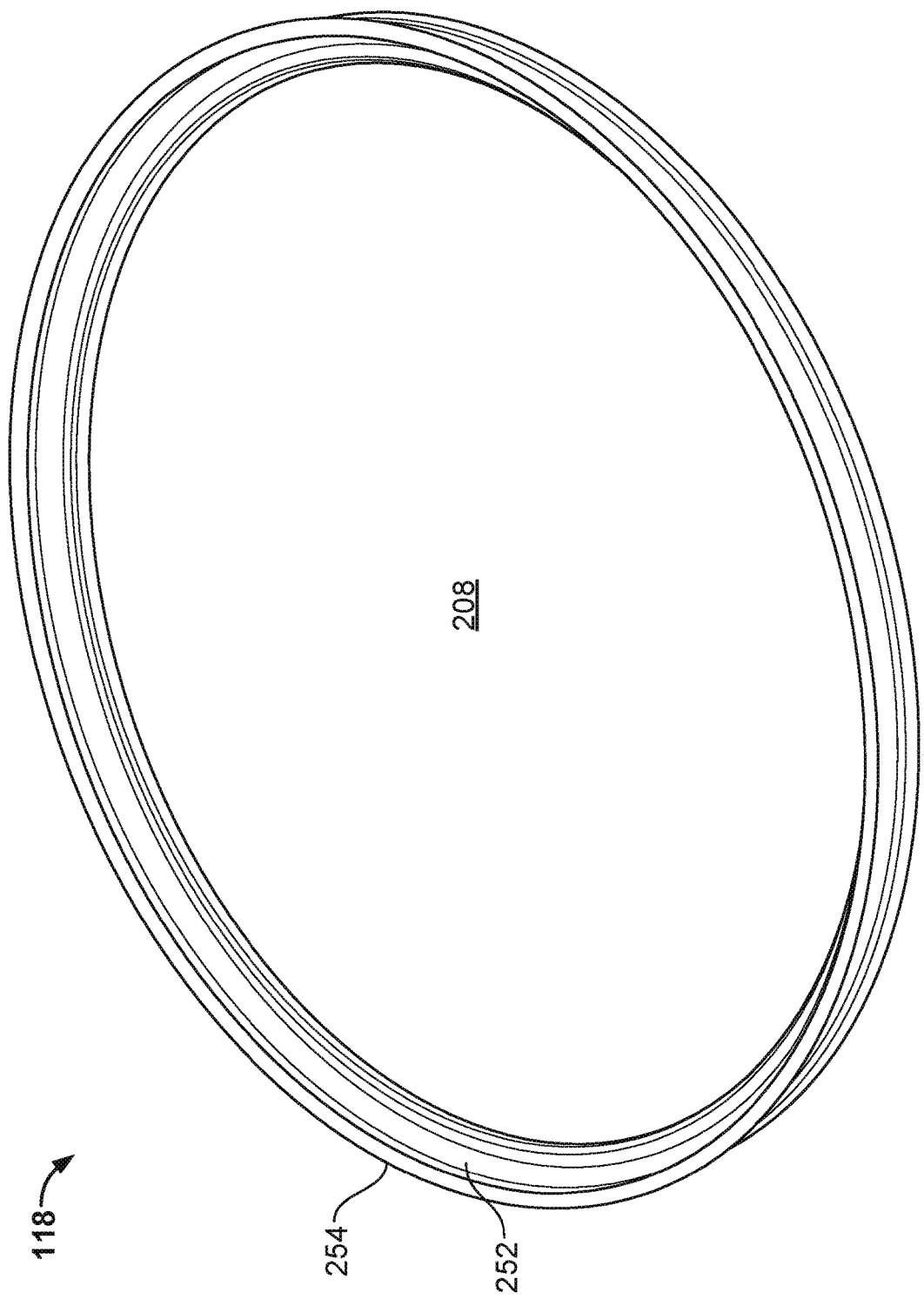
FIG. 2 is an illustration of a flexible membrane for use in a carrier head.

Flexible membrane 118 extends below base 104 to provide a mounting surface 274 for the substrate. Pressurization of a chamber 276 positioned below base 104 forces flexible membrane 118 downwardly to press the substrate against the polishing pad. Flexible membrane 118 is further illustrated in FIG. 2. Flexible membrane 118 is a generally circular sheet formed of a flexible and elastic material, such as a polymer of chloroprene, ethylene propylene, silicon, ethylene propylene diene M-class rubber or silicone rubber. A perimeter portion of flexible membrane 118 is secured to the base, e.g., clamped between the retaining ring 110 and the base 104. A bead 254 is formed around the boundary, e.g., outer edge of the perimeter portion of flexible membrane 118. In some embodiments, one or more cylindrical flaps extend upward from a main portion 208 of the membrane and bead 254 is at the end of cylindrical flap 252.

Figure 3:
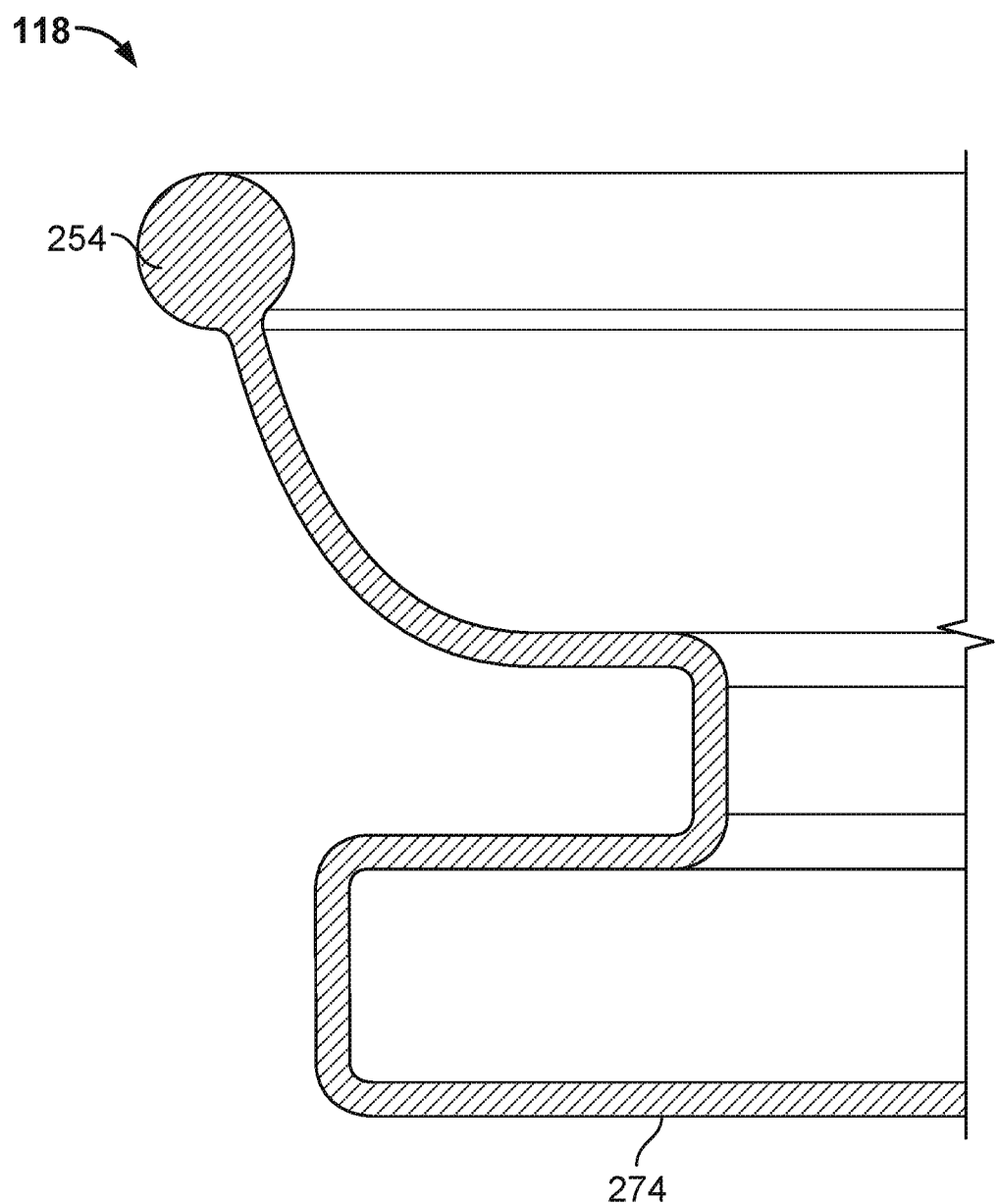
FIG. 3 is a schematic cross-sectional view of part of a flexible membrane for use in a carrier head.

FIG. 3 illustrates a diametric cross-section of part of flexible membrane 118. Referring back to FIG. 1, a bottom surface or the mounting surface 274 of flexible membrane 118 is in contact with substrate 10 during polishing. The sealed volume between flexible membrane 118, and base 104 defines pressurizable chamber 276. A pump (not shown) may be fluidly connected to chamber 276 to control the pressure in the chamber and thus the downward forces of the flexible membrane on the substrate. In operation, fluid is pumped into chamber 276 to control the downward pressure applied by flexible membrane 118 against the center portion of the substrate. When chamber 276 is pressurized, flexible membrane 118 will also expand laterally outward.

Figure 4:
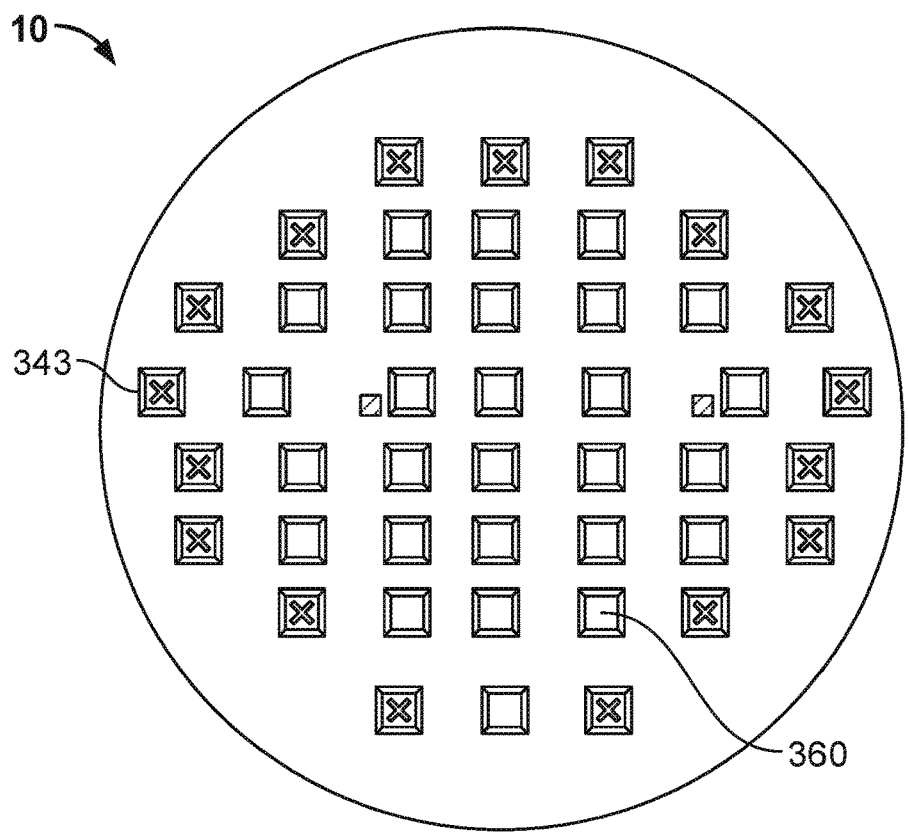
FIG. 4 is an illustration of a die map across a substrate.

As noted above, a reoccurring problem in CMP is underpolishing at an edge portion of the substrate. Consequences of such underpolishing are illustrated in FIG. 4. Each square in the diagram represents a die on a wafer substrate. The edge dies 343 with "X"s on an edge portion of the substrate represent portions with conductive material residue, such as copper residue, after polishing has completed at a central region of the substrate. If the substrate were polished sufficiently long to remove all of the residue from edge dies 343, overpolishing can occur at central dies 360. Overpolishing can result in dies with dishing or insufficient conductive material where conductive features are required. Polishing completion means that a target layer, e.g., copper, has been removed from over certain regions, such as non-conductive regions and between features on a die.

Polishing rates can be affected by a surface roughness of an outer surface of flexible membrane 118. In some embodiments, a surface roughness less than about 5 microinches has a higher polishing rate than the membranes with higher surface roughness values. A membrane with areas of varying surface roughness can be used to address the polishing requirements at different areas on the wafer.

Figure 5:
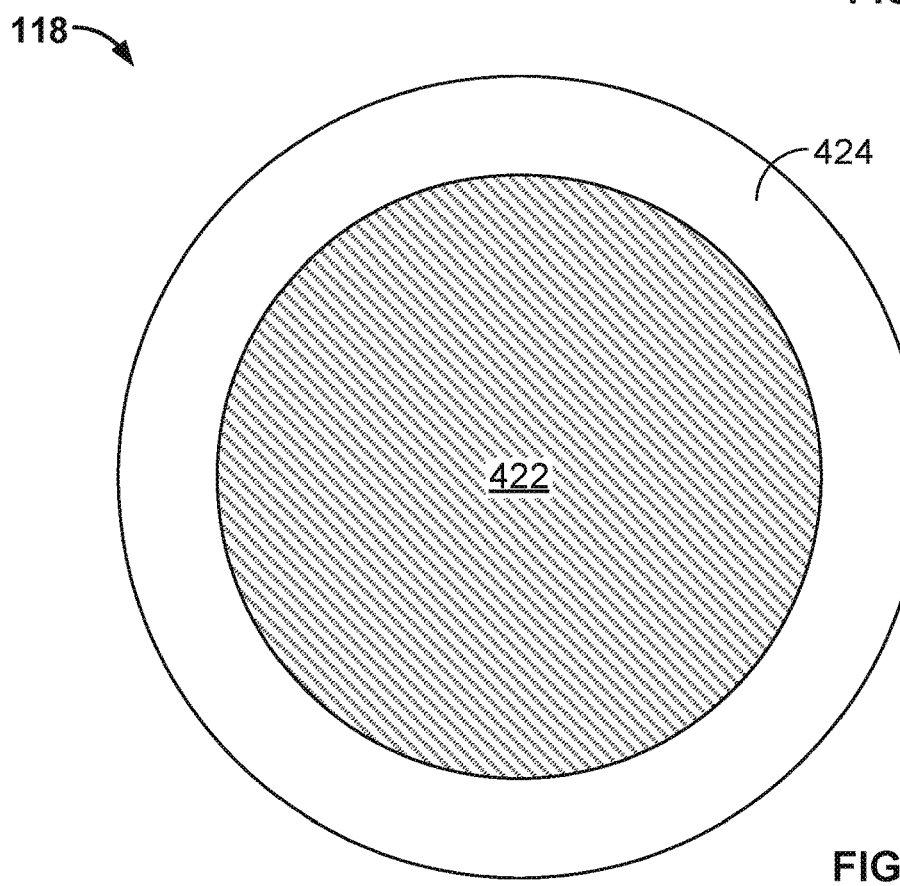
FIG. 5 is a schematic bottom view of an outer surface of a flexible membrane.

Referring to FIG. 1 and FIG. 5, in order to address underpolishing, such as at an edge portion of a substrate, the outer surface of flexible membrane 118 has a central portion 422 and an edge portion 424 surrounding central portion 422 with different surface roughness values. FIG. 5 provides a view of the face of the flexible membrane 118 shown in profile in FIG. 1. In some embodiments, the central portion of the outer surface of flexible membrane 118 has a surface roughness than the edge portion of the outer surface of flexible membrane 118. In some embodiments, the central portion's surface roughness is greater than about 15 microinches, such as greater than 20 microinches. In some embodiments, the edge portion's surface roughness is less than about 10 microinches, such as less than about 5 microinches, such as less than 3 microinches. The surface roughness of the edge portion 424 is less than the surface roughness of the central portion and in some embodiments, the surface roughness of the central portion is sufficient to prevent the membrane from sticking to a backside of a substrate. The precise surface roughness required to prevent sticking to the substrate can depend on the membrane material. Also, if the membrane is used in combination with a carrier head that is able to provide different loads to different parts of a substrate during polishing, the differential in roughness in the central portion 422 and the edge portion 424 may not need to be as great. For example, the central portion 422 can have a surface roughness greater than 10 microinches and the edge portion can have a surface roughness less than 10 microinches. Alternatively, the central portion 422 can have a surface roughness greater than 5 microinches and the edge portion can have a surface roughness less than 5 microinches. The central portion 422 can have a surface roughness greater than 15 microinches and the edge portion can have a surface roughness less than 15 microinches.

The central portion 422 can have a surface roughness greater than 15 microinches and the edge portion can have a surface roughness less than 15 microinches.

The edge portion of the outer surface of flexible membrane 118 with the reduced surface roughness can have a width that is less than about 25 percent of a width of the central portion of the outer surface of flexible membrane 118, such as less than 20%, less than 15%, less than 10% or less than 5% of the width of the central portion. The ratio of the width of the central portion to the ratio of the width of the edge portion can depend on the region of the substrate that needs increased polishing at the edge. In some embodiments, at least 50% of the membrane surface has a roughness greater than 15 microinches to reduce a surface tension between the membrane and the substrate to dechucking, as described below. In some embodiments, the central portion 422 and the edge portion 424 are composed of the same material. That is, there is no coating of a different material from the membrane required to form the smooth or rough regions on the membrane. In some embodiments, flexible membrane 118 has a surface roughness profile across the membrane such that the gradient of the surface roughness profile with respect to a distance from a center point of the membrane is negative. In some embodiments, the central portion has a circular shape and the edge portion has an annular shape.

Surface roughness profiles can be generated via a mold designed to form features of varying size and density on the outer surface of flexible membrane 118. In this way, the features can be formed of the same material as that of flexible membrane 118. The mold can be formed of a rigid material, such as stainless steel. A portion of the mold can be polished to form the smooth region or regions of the membrane and a portion of the mold can be treated, such as by sandblasting, to form the rougher regions of the membrane. In some embodiments, a mold can be constructed such that a flexible membrane formed by the mold has features that have a first mean spacing over the central portion of the outer surface of the flexible membrane and a second mean spacing over the edge portion of the outer surface of the flexible membrane. In some embodiments, the features in the central portion 422 may take the form of e.g., spherical bumps, pyramidal bumps, or linear bumps, and the features in the edge portion 424 are of negligible size or the edge portion 424 lacks bumps.

Polishing a substrate with carrier head using a flexible membrane having a smooth edge region and a rougher central region involves applying a load to substrate with the carrier head by increasing a pressure within a pressurizable chamber defined in part by the membrane. As stated above, the increase of pressure can be effected by introducing a fluid into pressurizable chamber.

The carrier head then creates a relative motion between substrate and polishing pad while applying the load. While the relative motion causes polishing of the substrate, the difference in surface roughness between the central and edge portions of the outer surface of flexible membrane causes a difference in polishing rates in the corresponding regions of substrate. The greater surface roughness at the edge of the membrane causes an edge of the substrate to be polished at a rate greater than polishing the substrate with a carrier head using a membrane having the a uniform roughness across an entirety of the outer surface. In polishing processes which tend to cause underpolishing in the edge regions of the substrate with a uniform surface roughness profile, such a multizone rough and smooth membrane may result in uniform polishing across substrate.

Upon completion of the polishing of substrate, the carrier head ideally releases substrate without breaking the substrate. Typically, release of substrate is achieved through pressurizing the pressurizable chamber backing the substrate until at least a portion of substrate is separated from the flexible membrane. An increased surface roughness in the central portion of the outer surface of flexible membrane results in a less sticky surface. The less sticky surface enables separation of the substrate from flexible membrane and eases dechuck.

The apparatuses and methods described above have been described in terms of a number of embodiments. The apparatuses and methods, however, are not limited to the embodiments depicted and described. Accordingly, other embodiments are within the scope of the following claims.

What is claimed is:

1. A method of fabricating a membrane for a carrier head of a chemical mechanical polishing apparatus, the method comprising:
   molding a material in a mold to provide a membrane, wherein:
   a surface of the mold has a first region that is sandblasted and a second region surrounding the first region that is smoother than the first region such that, when the membrane is molded in the mold, the surface of the mold forms a substrate receiving surface of the membrane having a central portion and an edge portion surrounding the central portion, and the first region of the mold forms the central portion of the substrate receiving surface with a first surface roughness and the second region of the mold forms the edge portion of the substrate receiving surface with a second surface roughness less than the first surface roughness.

2. The method of claim 1, wherein the second region of the surface of the mold is polished.

3. The method of claim 1, wherein the mold comprises a stainless steel mold.

4. The method of claim 1, wherein the second surface roughness is less than about 10 microinches.

5. The method of claim 4, wherein the second surface roughness is less than about 5 microinches.

6. The method of claim 4, wherein the first surface roughness is greater than about 15 microinches.

7. The method of claim 4, wherein the first surface roughness is greater than 20 microinches.

8. The method of claim 1, wherein a surface roughness profile across the substrate receiving surface has a negative gradient with respect to a distance from a center point of the membrane.

9. The method of claim 1, wherein the first surface roughness of the central portion is sufficient to prevent from sticking to a backside of a substrate.

10. The method of claim 1, wherein a width of the edge portion is less than about 25 percent of a width of the central portion.

11. The method of claim 1, wherein the edge portion and the central portion consist of the same material.

12. The method of claim 1, wherein the material is selected from a group consisting of chloroprene, silicon, and ethylene propylene diene M-class rubber.

* * * * *